United States Patent
Yang

(10) Patent No.: US 9,349,959 B2
(45) Date of Patent: May 24, 2016

(54) METHOD OF MANUFACTURING A POLYMER MOLECULAR FILM

(71) Applicant: NATIONAL TSING HUA UNIVERSITY, Hsinchu (TW)

(72) Inventor: Arnold Chang-Mou Yang, Hsinchu (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 0 days.

(21) Appl. No.: 14/303,404

(22) Filed: Jun. 12, 2014

(65) Prior Publication Data

US 2014/0295137 A1 Oct. 2, 2014

Related U.S. Application Data

(62) Division of application No. 12/571,110, filed on Sep. 30, 2009, now Pat. No. 8,790,746.

(30) Foreign Application Priority Data

Dec. 24, 2008 (TW) ............................. 97150547 A

(51) Int. Cl.
| | |
|---|---|
| B05D 5/12 | (2006.01) |
| H01L 51/00 | (2006.01) |
| H01L 51/50 | (2006.01) |
| B32B 3/00 | (2006.01) |
| B05D 3/02 | (2006.01) |
| C08L 65/00 | (2006.01) |

(52) U.S. Cl.
CPC ........ *H01L 51/0038* (2013.01); *H01L 51/0003* (2013.01); *H01L 51/0026* (2013.01); *H01L 51/0035* (2013.01); *H01L 51/0036* (2013.01); *H01L 51/5012* (2013.01); *B05D 3/02* (2013.01); *B05D 5/12* (2013.01); *B32B 3/00* (2013.01); *C08G 2261/312* (2013.01); *C08G 2261/3223* (2013.01); *C08G 2261/3422* (2013.01); *C08L 65/00* (2013.01); *H01L 51/0008* (2013.01); *H01L 2251/558* (2013.01); *Y10T 428/24355* (2015.01); *Y10T 428/24612* (2015.01); *Y10T 428/31938* (2015.04)

(58) Field of Classification Search
USPC .......................................................... 427/74
See application file for complete search history.

(56) References Cited

U.S. PATENT DOCUMENTS

| | | | | |
|---|---|---|---|---|
| 5,217,650 | A * | 6/1993 | Theophilou et al. | 252/500 |
| 5,932,965 | A * | 8/1999 | Berggren et al. | 313/506 |
| 2008/0158490 | A1* | 7/2008 | Nakayama et al. | 349/117 |
| 2011/0037087 | A1* | 2/2011 | Watanabe et al. | 257/94 |

* cited by examiner

*Primary Examiner* — Brian K Talbot
(74) *Attorney, Agent, or Firm* — WPAT, P.C., Intellectual Property Attorneys; Anthony King

(57) ABSTRACT

The present invention provides a polymer molecular film, a photo-electronic element comprising the same and method for manufacturing the same. The polymer molecular film of the invention is formed via a deformation process on a substrate. Particularly, the polymer molecular film includes a plurality of conjugated polymers, therein at least one of the conjugated polymers has a stretched molecular structure. As a result, the photo-electronic element having said polymer molecular film performs with good lighting or power generating efficiency.

5 Claims, 5 Drawing Sheets

METHOD OF MANUFACTURING A POLYMER MOLECULAR FILM

CROSS-REFERENCE TO RELATED APPLICATIONS

This application is a Divisional of the U.S. patent application Ser. No. 12/571,110 filed on Sep. 30, 2009, which claims foreign priority to 097150574 filed on Dec. 24, 2008, all of which is hereby incorporated by reference in its entirety.

Although incorporated by reference in its entirety, no arguments or disclaimers made in the parent application apply to this divisional application. Any disclaimer that may have occurred during the prosecution of the above-referenced application(s) is hereby expressly rescinded. Consequently, the Patent Office is asked to review the new set of claims in view of the entire prior art of record and any search that the Office deems appropriate.

FIELD OF THE INVENTION

This invention relates to a polymer molecular film, a photo-electronic element and a method for manufacturing the same.

BACKGROUND OF THE INVENTION

Polymer is constructed by repetitive chemical bonding between low molar mass molecules. The common structures can be linear, network, or branched. Although conventional polymeric materials are generally insulators, polymers with conjugated chain structures are capable to conduct electricity by transport of pi electrons. Particularly, with the procedures of redox reactions, the conductivity of conjugated polymers can reach the levels of doped inorganic semiconductors or some conductors. This unique property, when combined with other important advantages such as low material cost, simple fabrication processes, compatibility with large area manufacturing, light weights, and bendable mechanical properties, has made conjugated polymers emerging as the vital candidate for next generation optoelectronics.

For example, PLEDs (polymer light emitting diode) are the application that is widely studied. In short, conjugated polymers are used as a kind of light emitting material, which in turn is applied between positive electrodes and negative electrodes to form light emitting films. When forward bias is applied, holes are injected into the polymer molecular film from the positive electrodes and enter valence band to become positive polarons. Moreover, electrons are injected from negative electrodes and enter a conducting band to become negative polarons. And the two polarons move in the opposing directions to be combined to emit fluorescence (visible light).

Polymer LEDs can become polymer semiconductor laser with proper design and manufacturing process. The operation principle of the polymer semiconductor laser is generally similar to that of polymer LEDs, but that the resonant cavity structure is particularly introduced and population inversion is achieved by suitable electron levels, so that when the light is transmitted in the semiconductor polymer layer, energy gap wavelength photons are stimulated to emit high intensity coherent light.

For example, the elements having the similar structure to the aforementioned structures can also be used to generate electrical power, such as using that to manufacture an electrical power generating element using solar energy. Using the energy of the photons to separate the electrons and the holes. After being separated, the holes move towards positive electrodes, and the electrons move towards negative electrodes so as to form charges needed by external circuits, and the photonic energy can be transformed into electrical energy.

No matter it's the aforementioned light emitting or electrical power generating elements, better efficiency is needed for increasing the applicability thereof.

SUMMARY OF THE INVENTION

Therefore, the first objective of this invention is to provide a polymer molecular film. Particularly, the polymer molecular film has higher light-emitting/power-generating efficiency, which can be widely applied in manufacturing all kinds of photo-electronic elements.

According to an embodiment, the polymer molecular film is formed on a substrate through a deformation process. Particularly, the polymer molecular films comprise a plurality of conjugated polymers, wherein at least one of the plurality of conjugated polymers has a stretched molecular structure.

The second objective of this invention is to provide a method for manufacturing aforementioned polymer molecular films.

According an embodiment, the method includes the following steps: First, applying a conjugated polymeric material on a substrate to form a polymeric material layer; then, un-stabilizing the polymeric material layer to form a polymer molecular film; wherein, at least one conjugated polymer of the polymer molecular films has a stretched molecular structure.

In an embodiment, the step of un-stabilizing the polymeric material layer to form the polymer molecular film further comprises: disposing the polymeric material layer in vapor of a solvent.

In another embodiment, the step of unstablizing the polymeric material layer to form the polymer molecular film further comprises: heating the polymeric material layer until the temperature is higher than glass transition temperature of the conjugated polymeric materials.

The third objective of this invention is to provide a photo-electronic element, comprising the aforementioned polymer molecular films, so that the photo-electronic element has higher light-emitting/power-generating efficiency.

According to an embodiment, the photo-electronic element comprises a substrate, the polymer molecular film and a protection layer. The substrate and the protection layer can also be the transporting layer for the electrodes, or electrons and holes. The polymer molecular film is formed on the substrate, and the protection layer is formed on the polymer molecular film to prevent the polymer molecular film from oxidation or wear.

The fourth objective of this invention is to provide the method for manufacturing the aforementioned photo-electronic elements.

According to an embodiment, the steps of the method include the following: First, preparing a substrate, then applying a conjugated polymeric material on the substrate to form a polymeric material layer, and then un-stabilizing the polymeric material layer to form the polymer molecular film; wherein, at least one conjugated polymer in the polymer molecular films has a stretched molecular structure.

The advantages and the spirits of this invention can be further understood with the following description and the appended drawings.

DETAILED DESCRIPTION OF THE INVENTION

This invention provides a sort of polymer molecular film, photo-electronic element, and the method of manufacturing the polymer molecular film and the photo-electronic element. The followings are the embodiment and the practical applications of the invention, and those will be further described to better explain the characteristics, spirits and advantages of this invention.

Figure 1:
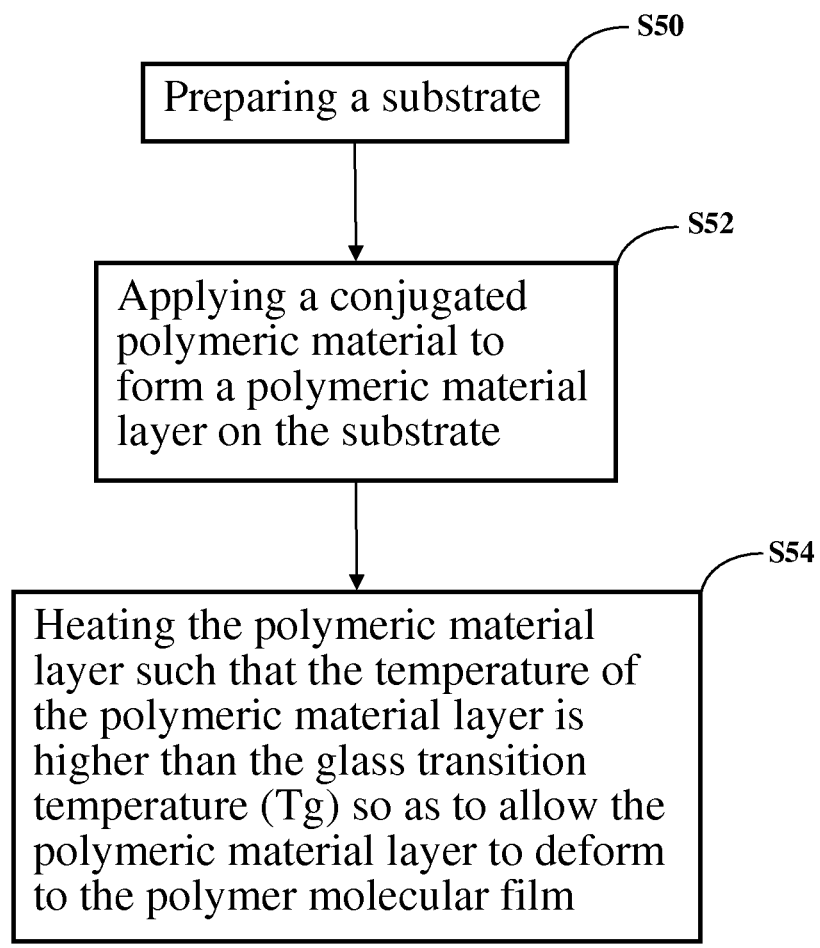
FIG. 1 illustrates a flow chart of an exemplary polymer molecular film manufacturing method in accordance with embodiments of this invention.
Figure 2A:
FIG. 2A illustrates an exemplary substrate in accordance with embodiments of this invention.
Figure 2B:
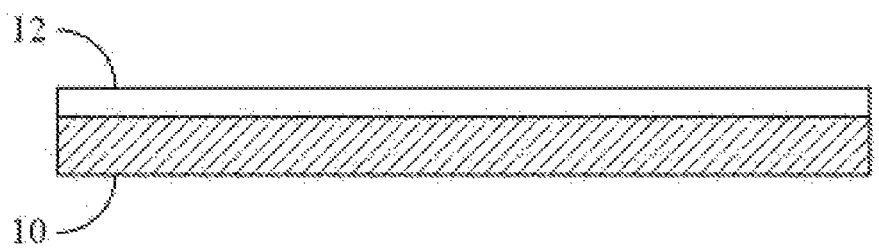
FIG. 2B illustrates an exemplary polymeric material layer in accordance with embodiments of this invention.
Figure 2C:
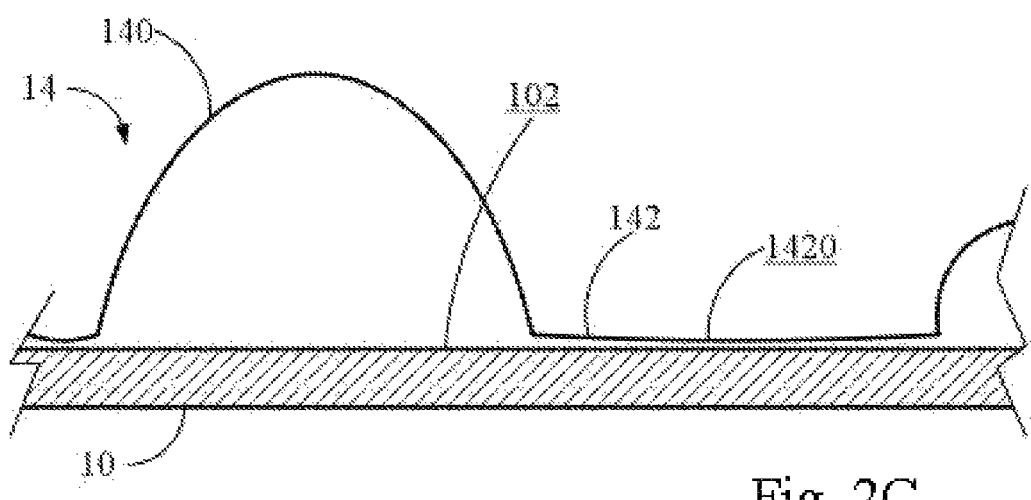
FIG. 2C illustrates an exemplary polymer molecular film in accordance with embodiments of this invention.

Please refer to FIG. 1 and FIG. 2A to FIG. 2C. FIG. 1 illustrates the flow chart of the polymer molecular film manufacturing method of an embodiment of this invention. FIG. 2A illustrates the substrate 10 formed by Step S50 in FIG. 1; FIG. 2B illustrates the polymeric material layer 12 formed by Step S52 in FIG. 1; and FIG. 2C illustrates the polymer molecular film 14 formed by Step S54 in FIG. 1. As illustrated, the manufacturing method according to this embodiment includes the following steps:

Step S50, preparing a substrate 10, for example but not limited to, a glass substrate, Indium Tin Oxides (ITO), etc.

Step S52, applying conjugated polymeric material to form a polymeric material layer 12 on the substrate 10. In practice, the conjugated polymeric material is applied to the substrate 10 by spin coating or other proper means. In practice, the thickness of the polymeric material layer 12 is less than 300 nm, such as 200 nm, 100 nm, 50 nm, and preferably less than 30 nm. In practice, the conjugated polymeric material can be a single polymer or several polymers composed of a sort of mixture or copolymer. The conjugated polymer includes, but not limited to, poly[1-methoxy-4-(2'-ethyl-hexyloxy)-2,5-phenylene vinylenel] (MEH-PPV), polythiophene or polyphenylene, etc. Moreover, in practice, the conjugated polymeric material may include other nonconjugated polymeric materials, such as polystyrene (PS), as well as other proper additives.

Step S54, heating the polymeric material layer 12 such that the temperature of the polymeric material layer 12 is higher than the glass transition temperature (Tg) so as to allow the polymeric material layer 12 to deform to the polymer molecular film 14.q As illustrated by FIG. 2C, the polymer molecular film 14 has a plurality of protrusion areas 140 and, possibly, a plurality of serial indentation areas 142. Particularly, at least one conjugated polymer of the plurality of indentation areas 142 has a stretched molecular structure in unilateral direction. Furthermore, in practice, the distance between the surface 1420 of the indentation area 142 and the surface 102 of the substrate 10 is less than 100 nm; for example, between 0.5 nm and 50 nm, and preferably less than 20 nm. In practice, by surface treatment to the substrate surface, the thickness of the indentation areas can be controlled.

In practice, Step S54 is the conventional dewetting step. This step can drag conjugated polymers on the surface of the substrate to form a film having stretched molecular structures, and the originally flat polymeric material layer is now fractured to form droplets (same as the protrusion area described above). Because the conjugated polymers are stretched, the conjugated polymeric chains are less likely to be bent, so that the charges (including electrons and holes) can move freely on the polymer chains without being trapped by polymer chains and therefore, it is easier to emit light/generate power. After the preliminary experiment, the luminous efficiency of the polymer molecular film after being dewetted has at least one order of magnitude higher than that of the polymer molecular film before being dewetted.

Figure 3:
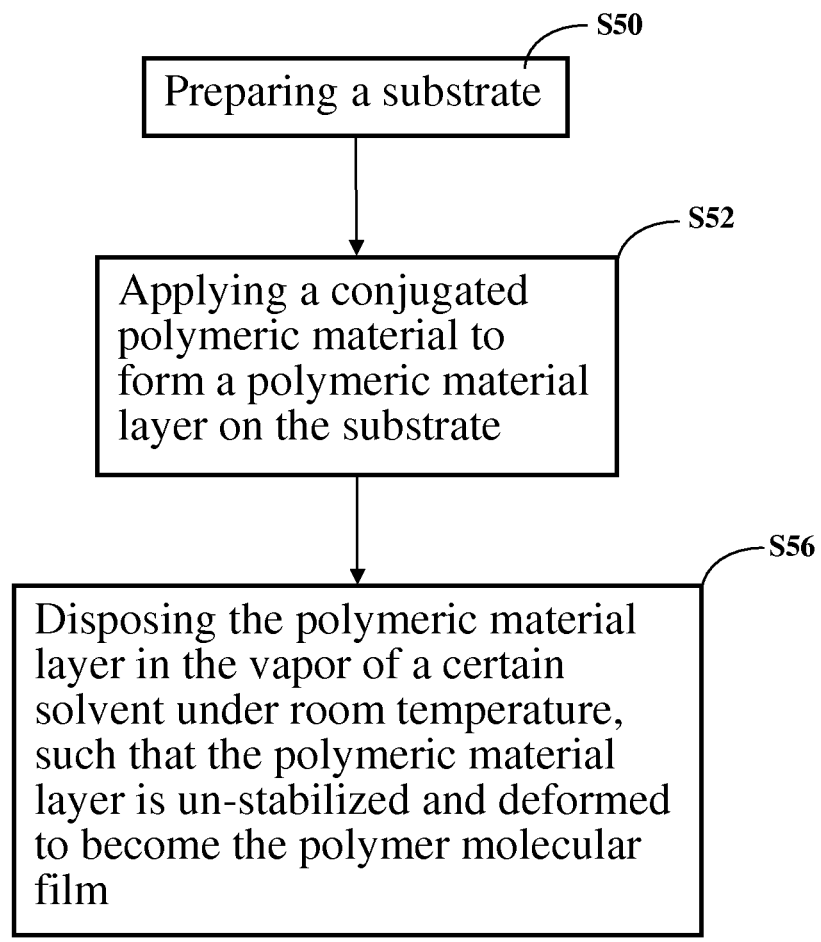
FIG. 3 illustrates an exemplary flow chart of the polymer molecular film manufacturing method in accordance with embodiments of this invention.

Please refer to FIG. 3. FIG. 3 illustrates a flow chart of the polymer molecular film manufacturing method of a different embodiment of this invention. As illustrated by FIG. 3, Step S54 in FIG. 1 can be replaced by Step S56 which proceeds the followings: under room temperature, disposing the polymeric material layer in the vapor of a certain solvent (such as Toluene, p-toluene, Tetrahydrofuran (THF), methanol or other proper solvents), such that the polymeric material layer 12 is un-stabilized and deformed to become the polymer molecular film 14.

Moreover, in practice, the aforementioned Step S52 and S54/S56 can be repetitively implemented to form multiple polymer molecular film layers to increase light-emitting/power-generating efficiency. Moreover, in practice, the method of this invention can also include the following steps: removing the parts of the protrusion areas which are higher than the indentation areas, such that the polymer molecular film has the surface that is generally flat. By doing this, the situation that the light emitted from the indentation area is affected by the protrusion areas can be avoided. On the contrary, when Step S52 and S54 are implemented repetitively to form multiple polymer molecular film layers, the protrusion areas may be remained, so as to help fix the bonding between the films.

Figure 4:
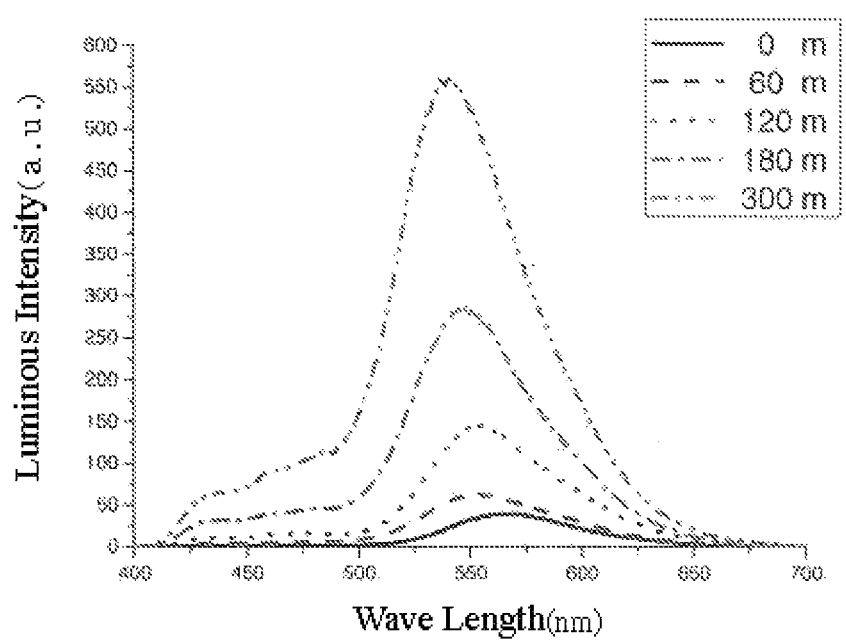
FIG. 4 illustrates an exemplary polymer molecular film in accordance with embodiments of this invention correspond to the photoluminance spectra of different dewetting time during dewetting process.

Please refer to FIG. 4. FIG. 4 illustrates polymer molecular films of an embodiment of this invention during dewetting process, corresponding to the photoluminance spectra in different dewetting time. In this embodiment, luminous polymeric material MEH-PPV is spin coated on a silicone oxide to form a film with 20 nm thickness, and disposed in an environment of 100 degrees (° C.) of temperature for different time periods to implement dewetting. Moreover, FIG. 4 shows the results generated by a fluorescence spectrometer. As illustrated by the figure, when the dewetting time period is 300 minutes, the film is completely dewetted and the luminous efficiency increases 30 times to that of the film before dewetting.

This invention further provides method for manufacturing the photo-electronic element having therein the aforementioned polymer molecular films. The photo-electronic element can be applied in many different fields; for example, used as polymer LEDs, polymer semiconductor laser, solar cell elements, etc, but not limited to thereto.

Figure 5:
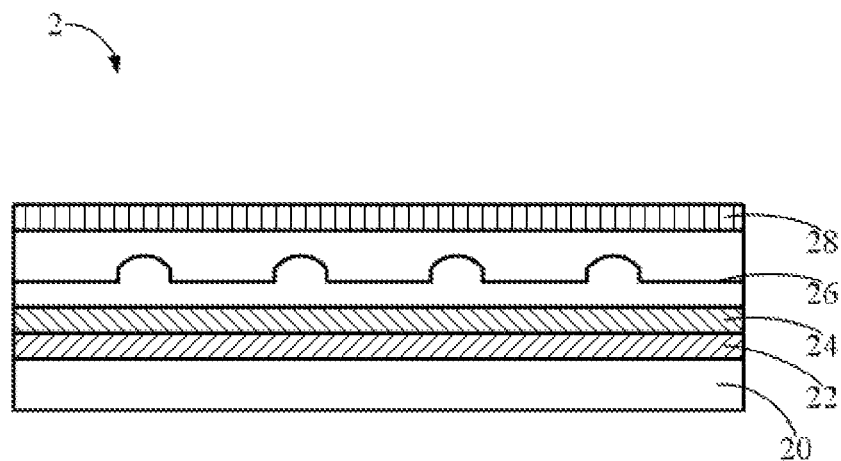
FIG. 5 illustrates the cross-sectional view of an exemplary light emitting element in accordance with embodiments of this invention.

Please refer to FIG. 5. FIG. 5 schematically illustrates the cross-sectional view of the light-emitting element of the embodiment of this invention. As illustrated by the figure, according to the light emitting element 2 of this invention includes a substrate 20, a positive electrode 22, a hole transporting layer 24, a light emitting layer 26 and a negative electrode 28.

In practice, the substrate 20 can be made of a transparent glass or other appropriate materials. The positive electrode 22 can be made of a conductive material, such as Indium oxide (ITO). The hole transporting layer 24 can be made of conductive polymeric material (3,4-polyethylenedioxythiophene/polystyrenesulfonate blend, PEDOT/PSS). The light emitting layer 26 is made of polymer molecular film of this invention. Moreover, the negative electrodes 28 can be made of aluminum or other metals.

In practice, according to the photo-electronic element of this invention apart from the aforementioned substrates and polymer molecular films, it also includes a protection layer formed on the polymer molecular film to prevent the polymer molecular film from oxidation or wear.

Moreover, the photo-electronic element of this invention can include positive and negative electrodes respectively disposed on the substrate and the protection layer. Of course, in practice, the photo-electronic element of this invention can also include other functional layers depending on the situation without being limited by any specific types.

Furthermore, apart from the aforementioned designs that utilize the positive and negative electrodes positioned across the thickness of the molecular layer or layers, a parallel version of the electrodes with the positive and negative electrodes situated on a plane parallel to the plane of the molecular film can also be opted.

To conclude, the polymer molecular films and the photo-electronic element of this invention increase the light-emitting/power-generating efficiency by the indentation areas formed by stretched conjugated polymers. Moreover, this process can be achieved without taking much time and costing much money, which is highly industrially applicable.

Although this invention has been disclosed better as above by the embodiments, they are not intended to limit the scope of this invention. An ordinary skilled person in the art can make any modification and improvements without departing from the spirit and scope of this invention. Therefore, the protection scope of this invention is defined by the appended claims.

What is claimed is:

1. A method of manufacturing a polymer molecular film, comprising the steps of:
applying a conjugated polymeric material on a substrate to form a polymeric material layer; and
un-stabilizing the conjugated polymeric material layer by a dewetting process without being stretched additionally by mechanical forces to form the polymer molecular film; wherein at least one conjugated polymer of the polymer molecular film has a stretched molecular structure therein.

2. The method of claim 1, wherein the step of un-stabilizing the polymeric material layer to form the polymer molecular film further comprises:
heating the polymeric material layer until the temperature of the polymeric material layer is higher than the glass transition temperature of the polymeric material layer.

3. The method of claim 1, wherein the polymer molecular film further comprises a plurality of protrusion areas and at least one indentation area, wherein at least one conjugated polymer of the stretched molecular structure is located in the indentation area.

4. The method of claim 3, further comprising:
removing the parts of the protrusion areas which are higher than the indentation areas, such that the polymer molecular film has a flat surface.

5. The method of claim 1, wherein the conjugated polymer is selected from the group consisting of poly[1-methoxy-4-(2'-ethyl-hexyloxy)-2,5-phenylene vinylene] (MEH-PPV), polythiophene and polyphenylene.

* * * * *